(12) United States Patent
Chow et al.

(10) Patent No.: US 8,519,534 B2
(45) Date of Patent: Aug. 27, 2013

(54) MICROSPRINGS PARTIALLY EMBEDDED IN A LAMINATE STRUCTURE AND METHODS FOR PRODUCING SAME

(75) Inventors: Eugene M. Chow, Fremont, CA (US); Eric Peeters, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 25 days.

(21) Appl. No.: 12/887,775

(22) Filed: Sep. 22, 2010

(65) Prior Publication Data

US 2012/0068331 A1 Mar. 22, 2012

(51) Int. Cl.
*H01L 23/48* (2006.01)

(52) U.S. Cl.
USPC ............ 257/735; 257/E23.078; 257/E21.506; 438/611

(58) Field of Classification Search
USPC ........... 257/735, E23.078, E21.506; 438/611
See application file for complete search history.

(56) References Cited

U.S. PATENT DOCUMENTS

| | | | |
|---|---|---|---|
| 5,613,861 A | 3/1997 | Smith et al. |
| 5,783,870 A | 7/1998 | Mostafazadeh et al. |
| 5,848,685 A | 12/1998 | Smith et al. |
| 5,914,218 A | 6/1999 | Smith et al. |
| 5,944,537 A | 8/1999 | Smith et al. |
| 5,979,892 A | 11/1999 | Smith |
| 6,184,065 B1 | 2/2001 | Smith et al. |
| 6,184,699 B1 | 2/2001 | Smith et al. |
| 6,213,789 B1 | 4/2001 | Chua et al. |
| 6,264,477 B1 | 7/2001 | Smith et al. |
| 6,290,510 B1 | 9/2001 | Fork et al. |
| 6,299,462 B1 | 10/2001 | Biegelsen |
| 6,352,454 B1 | 3/2002 | Kim et al. |
| 6,361,331 B2 | 3/2002 | Fork et al. |
| 6,392,524 B1 | 5/2002 | Biegelsen et al. |
| 6,396,677 B1 | 5/2002 | Chua et al. |
| 6,439,898 B2 | 8/2002 | Chua et al. |
| 6,504,643 B1 | 1/2003 | Peeters et al. |
| 6,521,970 B1 | 2/2003 | Takiar et al. |
| 6,528,350 B2 | 3/2003 | Fork |
| 6,534,249 B2 | 3/2003 | Fork et al. |
| 6,560,861 B2 | 5/2003 | Fork et al. |
| 6,582,989 B2 | 6/2003 | Biegelsen et al. |
| 6,595,787 B2 | 7/2003 | Fork et al. |
| 6,606,235 B2 | 8/2003 | Chua et al. |
| 6,621,141 B1 | 9/2003 | Van Schuylenbergh et al. |
| 6,632,373 B1 | 10/2003 | Rosa et al. |
| 6,646,533 B2 | 11/2003 | Biegelson et al. |
| 6,649,441 B2 * | 11/2003 | Ruf ................................ 438/50 |
| 6,655,964 B2 | 12/2003 | Fork et al. |
| 6,658,728 B2 | 12/2003 | Fork et al. |

(Continued)

*Primary Examiner* — Trung Q Dang
(74) *Attorney, Agent, or Firm* — Jonathan A. Small

(57) ABSTRACT

At least one microspring has applied thereover a laminate structure to provide: mechanical protection during handling and wafer processing, a spring spacer layer, strengthening of the anchor between spring and substrate, provision of a gap stop during spring deflection, and moisture and contaminant protection. A fully-formed laminate structure may be applied over the microspring structure or a partly-formed laminate structure may be applied over the microspring structure then cured or hardened. The tip portion of the microspring may protrude through the laminate structure and be exposed for contact or may be buried within the contact structure. The laminate structure may remain in place in the final microspring structure or be removed in whole or in part. The laminate structure may be photolithographically patternable material, patterned and etched to remove some or all of the structure, forming for example additional structural elements such as a gap stop for the microspring.

19 Claims, 12 Drawing Sheets

(56) References Cited

U.S. PATENT DOCUMENTS

| | | |
|---|---|---|
| 6,668,628 B2 | 12/2003 | Hantschel et al. |
| 6,672,875 B1 | 1/2004 | Mathieu et al. |
| 6,684,499 B2 | 2/2004 | Romano et al. |
| 6,734,425 B2 | 5/2004 | Hantschel et al. |
| 6,743,982 B2 | 6/2004 | Biegelsen et al. |
| 6,777,963 B2 | 8/2004 | Rutten |
| 6,788,086 B2 | 9/2004 | Hantschel et al. |
| 6,794,725 B2 | 9/2004 | Lemmi et al. |
| 6,794,737 B2 | 9/2004 | Romano et al. |
| 6,856,225 B1 | 2/2005 | Chua et al. |
| 6,922,327 B2 | 7/2005 | Chua et al. |
| 6,947,291 B2 | 9/2005 | Chua et al. |
| 6,998,703 B2 | 2/2006 | DiStefano et al. |
| 7,000,315 B2 | 2/2006 | Chua et al. |
| 7,015,584 B2 * | 3/2006 | Chow et al. .................. 257/773 |
| 7,166,326 B1 | 1/2007 | DiStefano |
| 7,230,440 B2 | 6/2007 | Hantschel et al. |
| 7,284,324 B2 | 10/2007 | Chua et al. |
| 7,400,041 B2 | 7/2008 | Muthukumar et al. |
| 7,426,117 B2 | 9/2008 | Van Schuylenbergh et al. |
| 2004/0022040 A1 | 2/2004 | Sitaraman et al. |
| 2004/0102064 A1* | 5/2004 | Mathieu .......................... 439/66 |
| 2004/0114259 A1 | 6/2004 | Ishizuya et al. |
| 2004/0163252 A1 | 8/2004 | Khandros et al. |
| 2004/0166702 A1* | 8/2004 | Higashi .......................... 439/66 |
| 2005/0006829 A1 | 1/2005 | Chow et al. |
| 2005/0017171 A1 | 1/2005 | Samuelson et al. |
| 2005/0121758 A1 | 6/2005 | DiStefano |
| 2006/0030179 A1 | 2/2006 | Van Schuylenbergh et al. |
| 2006/0076693 A1 | 4/2006 | Hantschel et al. |
| 2006/0242828 A1 | 11/2006 | Kirby et al. |
| 2007/0069751 A1 | 3/2007 | Hantschel et al. |
| 2007/0141742 A1 | 6/2007 | Chua et al. |
| 2007/0158816 A1 | 7/2007 | Chow et al. |
| 2008/0095996 A1 | 4/2008 | Chua et al. |

* cited by examiner

MICROSPRINGS PARTIALLY EMBEDDED IN A LAMINATE STRUCTURE AND METHODS FOR PRODUCING SAME

CROSS-REFERENCE TO RELATED FILINGS

The present application is related to U.S. application for letters patent Ser. No. 12/887,814, titled "Interposer with Microspring Contacts and Methods of Making Same", with the same filing date as the present case, and which is incorporated herein by reference.

BACKGROUND

The present disclosure relates generally to photolithographically patterned spring contacts, and more particularly to one or more released springs embedded in a laminate structure.

Photolithographically patterned spring devices (referred to herein as "microsprings") have been developed, for example, to produce low cost probe cards, and to provide electrical connections between integrated circuits. Such microsprings are disclosed and described, for example, in U.S. Pat. No. 5,914,218, which is incorporated by reference herein. A microspring is generally a micrometer-scale elongated metal structure having a free (cantilevered) portion which bends upward from an anchor portion which is affixed directly or indirectly to a substrate.

The microspring is formed from a stress-engineered metal film (i.e., a metal film fabricated to have a stress differential such that its lower portions have a higher internal compressive stress than its upper portions) that is at least partially formed on a release material layer. The microspring is attached to the substrate (or intermediate layer) at a proximal, anchor portion thereof. The microspring further includes a distal, tip portion which bends away from the substrate when the release material located under the tip portion is removed (e.g., by etching) or it is otherwise released.

The stress differential is produced in the spring material by one of several techniques. According to one technique, different materials are deposited in layers, each having a desired stress characteristic, for example a tensile layer formed over a compressive layer. According to another technique a single layer is provide with an intrinsic stress differential by altering the fabrication parameters as the layer is deposited. The spring material is typically a metal or metal alloy (e.g., Mo, MoCr, W, Ni, NiZr, Cu), and is typically chosen for its ability to retain large amounts of internal stress, electrical conductivity, and intrinsic strength. Microsprings are typically produced using known photolithography techniques to permit integration of the microsprings with other devices and interconnections formed on a common substrate. Indeed, such devices may be constructed on a substrate upon which electronic circuitry and/or elements have been or are formed.

The process of forming stress-engineered microsprings facilitates the formation of arrays of devices with contact points out of the plane in which the devices are initially formed. Linear and 2-d arrays can thereby be produced. In additional, multiple stress-engineered microsprings may be formed in an overlying relationship such that, for example, a lower stress-engineered microspring provides structural support for an upper stress-engineered microspring, as disclosed in U.S. Pat. No. 7,550,855, incorporated herein by reference.

Microsprings find a wide range of applications, such as probe cards, electrical bonding to integrated circuits, circuit boards, and electrode arrays, and for producing other devices such as inductors, variable capacitors, scanning probes, and actuated mirrors. For example, when utilized in a probe card application, the tip of the free portion of a microspring is brought into contact with a contact pad formed on an integrated circuit, and signals are passed between the integrated circuit and test equipment via the probe card (i.e., using the microspring as an electrical contact).

Typically, the array of microsprings is formed with a tip-to-tip spacing selected according to the application of the array. For example, for probe testing, the tip-to-tip spacing would match the spacing of contact pads, leads or the like on the device under test. FIG. 18 is a microphotograph of an array 100 of microsprings released from a substrate.

Microsprings typically terminate at a tip, whose shape may be controlled photolithographically as the microspring is pattered in-plane. In certain applications, the microspring has a tip profile (e.g., an apical point) capable of physically penetrating an oxide layer that may form on the surface to which electrical contact is to be made. An example of a microspring 102 having an anchor portion 104 and a tip 106 shaped to pierce a layer such as an oxide illustrated in plan view in FIG. 19, although many different tip shapes may similarly be employed.

In order to provide a reliable contact with a surface to be contacted, the microspring must provide a relatively high contact force (the force which the spring applies in resisting a force oppositely applied from the surface to be contacted). This is particularly true in applications in which the apical point must penetrate an oxide layer. For example, some probing and packaging applications require a contact force on the order of 50-100 mg between the tip and the structure being contacted.

One problem presented by common microspring structures and their applications is that once released, the springs are susceptible to breaking, either at a point along their length or at their point of connection (anchor) to the substrate. Microsprings can be broken by vertical compression beyond their elastic limit. Thinner springs are known to accommodate greater vertical deflection, but present a lower spring coefficient, meaning that for some applications they cannot provide sufficient counterforce, for example to penetrate an oxide layer. Thicker microsprings withstand greater applied force, but are known to be more brittle than thinner springs, and susceptible to bending beyond their elastic limit. One approach to reducing the risk of breaking, at least for thick microsprings, would be to form gap stops under a portion of the released part of the microspring. However, forming such stops would require extra lithographic steps, additional material, and still are only of limited effect in preventing breakage.

Microsprings springs can also break due to lateral forces applied at their sides, which twist the spring and often result in breaking near the anchor. Such forces may be applied during manufacture and handling of the microspring structure, placing the microspring structure into jigs, chucks or other holders for additional processing, alignment, assembly, etc. This results in a requirement that special handling precautions and techniques be employed when manipulating microspring arrays. For example, a wafer on which a microspring array has been formed cannot be held with normal contact vacuum wands without a significant risk of breaking one or more of the microsprings. Likewise, a wafer on which a microspring array is formed cannot be retain inverted on chucks, as is traditionally done and necessary for backside polishing of the wafer.

Photoresist is currently used to temporarily coat microsprings and protect them during dicing. It is possible to simply leave the photoresist, or a least a portion thereof, on the microsprings following release in order to provide additional structural strength to the individual springs. However, this requires expensive wet processing, processing of released microsprings, and other factors which add to cost and the risk of damaging the microsprings. In addition, the photoresist is not compatible with higher temperatures associated with solder processing.

SUMMARY

Accordingly, the present disclosure is directed to a structure, and method of producing same, which provides improved physical protection for microsprings to prevent mechanical damage. Additional benefits include but are not limited to the provision of a spring spacer layer, strengthening the anchor between spring and substrate, provision of a gap stop during spring deflection, and moisture and contaminant protection.

According to one aspect of the disclosure, at least one vertically displaced microspring is formed over a substrate. The microspring includes tailored stress profiles such that following release from the substrate on which it is formed, the microsprings assume a concave profile resulting from the stress profile. The microspring comprises an anchor section and a free (released) section including a tip. A laminate structure may be applied or formed over the microspring structure such that a portion of the microspring is embedded in the laminate structure, and another portion proximate the tip of the microspring is exposed.

The laminate structure may be preformed and the microspring tip pierces through it as it is placed over the microspring structure, or the structure may be formed and hardened or cured over the microspring structure. The laminate structure may remain in place when the microspring is in use, or may be removed in whole or in part.

The laminate structure may be of a thickness such that when applied or formed over the structure, a portion of the microspring protrudes therethrough and is thereby exposed for contact. Alternatively, the laminate structure may be applied such that the microspring is completely embedded therein. The microspring structure may then be handled and further processed, with the microspring protected within the laminate structure. Once handling and/or processing is complete, the laminate structure may be partly or completely removed from the microspring structure, leaving at least the microspring tip exposed for contact.

The laminate structure may be a homogeneous body, or may itself be formed of two or more layers. In the case that the laminate structure is formed of multiple layers, the layers may remain affixed over the microspring structure, or one or more of the layers may be removed, such as after handling and/or processing of the structure, to thereby expose at least the tip of the microspring for contact.

The laminate structure may be a photolithographically patternable material. Once formed, the laminate structure may then be patterned and etched to remove some or all of the structure. In the case where a portion of the laminate structure remains, that portion may protect the embedded portion of the microspring and/or serve as a gap stop to assist the spring in resisting over-deflection (i.e., non-elastic bending).

The laminate structure may form a mask, enabling the selective plating or deposition of material such as solder over the microspring tip region. Alternatively, the laminate structure may form a mask for etching, cleaning, or other processing of the tip portion of the microspring. In each case, the laminate structure may remain in place as part of the completed microspring structure or may be removed prior to completion of the structure.

Therefore, according to one aspect of the present disclosure, a microspring structure is provided that comprises a substrate, at least one microspring formed over said substrate, and a laminate structure formed over said substrate such that said microspring is at least partially embedded within said laminate structure. According to another aspect of the present disclosure, a method of fabricating a microspring structure is provided that comprises forming a microspring over a substrate, and forming a laminate structure over said substrate such that said microspring is at least partially embedded within said laminate structure.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well known details are merely summarized or are omitted so as not to unnecessarily obscure the details of the present disclosure. Thus, where details are otherwise well known, we leave it to the application of the present disclosure to suggest or dictate choices relating to those details.

Figure 1:
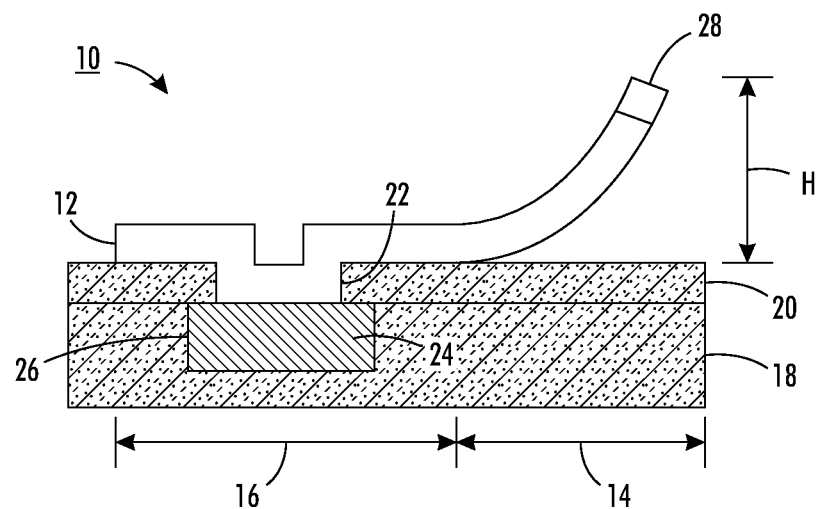
FIG. 1 is a side view of a microspring structure comprising a microspring formed over a dielectric layer carried by a substrate of a type that may form an embodiment of the present disclosure.

Shown in FIG. 1 is a side view of one embodiment of a microspring structure 10. While structure 10 includes a plurality of microsprings, only one such microspring 12 is shown. Microspring 12 comprises a free portion 14 and an anchor portion 16 fixed to a substrate 18 (e.g., glass, silicon, quartz, etc.). Prior to formation of microspring 12, a dielectric layer 20 was formed over the surface of substrate 18, and an opening 22 formed therein. Microspring 12 is formed over dielectric layer 20 such that it is electrically connected through opening 22 to a contact 24, formed for example in a via 26 in substrate 18. The connection between microspring 12 and contact 24 may provide both electrical intercommunication therebetween as well as physical connection further securing microspring 12 to substrate 18. Furthermore, microspring 12 may be connected to substrate 18 only at contact 24. In still other embodiments, microspring 12 is formed over and affixed to a separate anchor (not shown) which itself is attached to substrate 18, with or without a separate electrical contact. Multiple layers of stacked microsprings may also be formed, such as disclosed in the aforementioned U.S. Pat. No. 7,550,855.

Microspring 12 is made of an elastically deformable material, such as a molybdenum-chrome (MoCr) alloy, a nickel-zirconium (NiZr) alloy, or any of a variety of metals or alloys suitable for the creation of microsprings, such as Mo, MoCr, W, Ni, NiZr, Cu, diamond, or other alloys, non-metals, oxides, nitrides or organic materials. Preferably, the material from which microspring 12 is formed is electrically conductive, although it may be formed of a non-conductive or semi-conductive material. If formed of a non-conductive or semi-conductive material, microspring 12 may be coated or plated with an electrically conductive material, not shown, or deployed in applications that do not require electrically conductive contact.

As well understood, microspring 12 is initially formed in a plane which is roughly parallel to the plane of the surface of substrate 18. Formation is typically by photolithographic techniques well known in the art. The internal stress in microspring 12 varies along a vertical cross-section of the microspring. One of a variety of techniques, such as etch undercutting, is employed to release the free portion 14 of microspring 12, including tip 28, and the internal stress within microspring 12 causes tip 28 to pull up out of plane, creating a concave microspring as shown in FIG. 1.

In a typical embodiment, tip 28 rises to a height, H, above the surface of layer 20 on the order of 10-250 μm. The width of microspring 12 is typically in the range of 5-100 μm.

Figure 2:
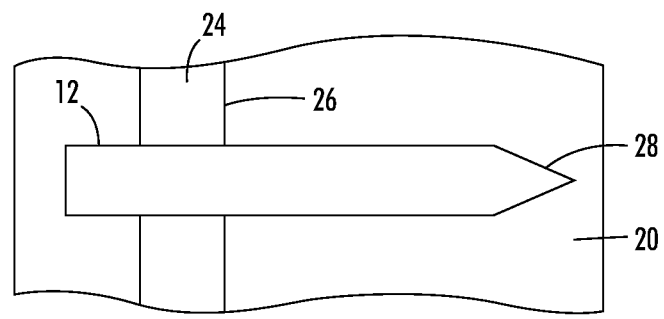
FIG. 2 is a plan view of a microspring having a point-shaped tip of a type that may form an embodiment of the present disclosure.

In certain embodiments, microspring 12 is formed to have a point-shaped tip 28, such as shown in FIG. 2, which is a plan view of microspring 12. Such a point-shape assists with piercing oxides or other layers for probe and contact applications. It may also assist with the application of a protection structure discussed further below. Many other tip shapes and designs are well known and may be utilized in the present disclosure.

Figure 3:
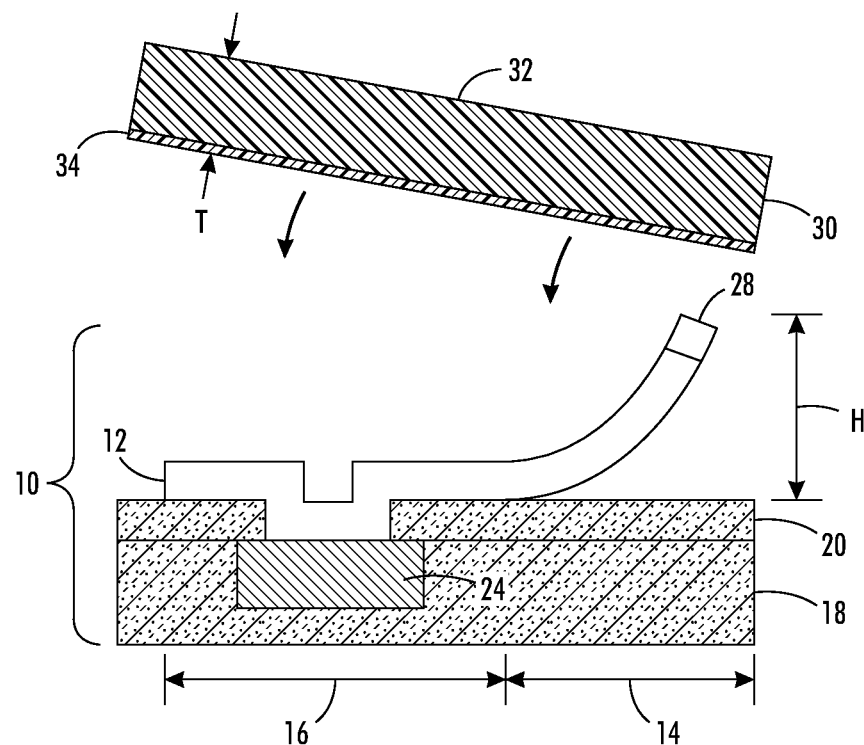
FIG. 3 is a side view of a microspring structure with a thin laminate structure in the process of being applied thereover according to one embodiment of the present disclosure.
Figure 4:
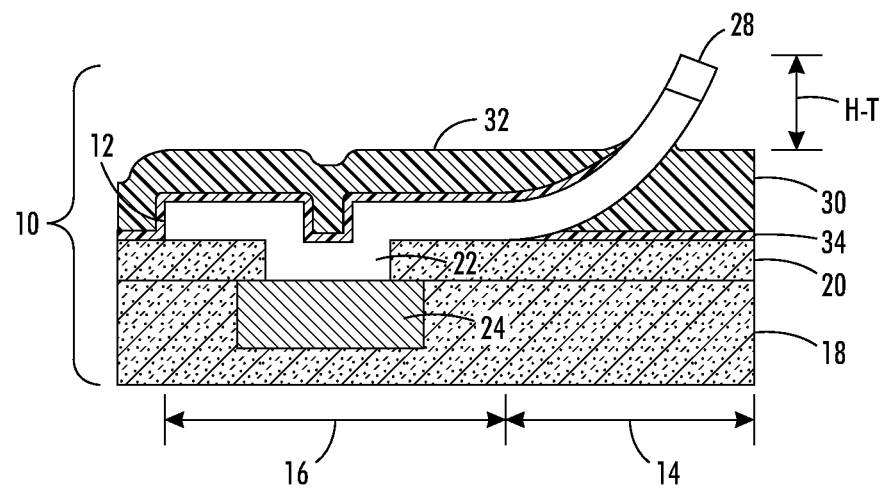
FIG. 4 is a side view of a microspring structure with a laminate structure applied thereover according to one embodiment of the present disclosure.

In a first embodiment, once free portion 14 is released, a protection structure, which in this embodiment is a thin laminate structure 30, is applied over the upper surface of structure 10. FIG. 3 shows laminate structure 30 being brought into position over structure 10. FIG. 4 shows laminate structure 30 secured in place over structure 10. Thin laminate structure 30 may be formed of a variety of different materials intended to be permanently applied over structure 10. Silicone is one exemplary material. Silicone is relatively soft and conformal, which is advantageous as will be appreciated from the description below. Another candidate material is known in the trade as Gel-Film, available from Gel-Pak, a division of Delphon Industries, LLC (see, e.g., www.gelpak.com/products/index.cfm?fuseaction=gel-film). For clarity, in this embodiment structure 30 is referred to as a "laminate" structure since in the process of forming the device it is applied, or laminated, over the already-formed microspring and substrate structure. Laminate structure 30 may be comprised of a single material, or may itself be a laminate of several material layers. In certain embodiments, laminate structure 30 may be handled via a carrier sheet (not shown), and transferred off said sheet during application. Laminate structure 30 is of a thickness T, on the order of 25 μm. In this embodiment, the laminate thickness T will be less that the height H of microspring 12, although in certain embodiments this may not be the case, at least initially. In other embodiments, such as described below, T may exceed H.

Thin laminate structure 30 is then removed from its backing, and applied over the upper surface of structure 10 such that tip 28 of microspring 12 pierces through laminate structure 30. Microspring 12 is undamaged due to the fact that tip 28 is quite small and relatively sharp, and the laminate is relatively soft. Appropriate pressure is applied to the upper surface 32 of structure 30 such that structure 30 generally conforms to the topography of the top surface of structure 10 and is well seated thereover. An optional adhesive layer 34 on the under surface of laminate structure 30 which contacts the upper surface of structure 10 (e.g., a part of the upper surfaces of microspring 12 and dielectric layer 20) may retain laminate structure 30 in place. In one embodiment it is advantageous to employ a soft, conformal material for structure 30 so that microspring 12 is not damaged in the process of piercing structure 30, and further so that structure 30 can contact a large portion of the non-planar upper surface of structure 10.

In certain embodiments it may be desirable to soften structure 30 prior to application, for example to provide a more conformal covering over the surface of structure 10, to further reduce the likelihood of damage to microspring 12 as it pierces structure 30, etc. Softening of structure 30 may be accomplished by heating, by chemical softening, or by other methods as may be known in the art. Furthermore, structure 30 may be comprised of a curable material such as a photo-curable epoxy or polymer. Initially, structure 30 is applied is a partly cured state such that it can maintain its physical structure, but is sufficiently soft so as to be conforming, relatively easy for microspring 12 to pierce, etc. Once applied, the curing of structure 30 can be completed, thereby providing a more rigid body in which microspring 12 is embedded. Still further, materials which can be softened after application over structure 10 may be used such that they are more rigid when disposed over structure 10, for example to protect microspring 12, but which can be softened by heat, chemical treatment, etc. to facilitate removal from structure 10 and microspring 12.

Tip 28 of microspring 12 then extends above the upper surface 32 of structure 30 by a distance approximately equal to H-T. Exposed tip 28 can then be used, for example, as an electrical contact.

At least a part of microspring 12, and specifically a part free portion 14 is thereby "within" laminate structure 30. It is one function of laminate structure 30 to physically support microspring 12. This support can be strength in all directions as the wafer bearing microspring 12 is handled, strength in the direction of deflection when microspring 12 is in spring-contact with a device thereover, and so on. Accordingly, laminate structure 30 should substantially be in contact with the surface of microspring 12, with few gaps therebetween. Laminate structure 30 must have some "give" or tolerance for deflection of microspring 12 while still providing overall added strength to microspring 12.

Laminate structure 30 may also act as a spacer, defining a minimum spacing between the upper surface of dielectric layer 20 and the lower surface of a structure (not shown) contacting tip 28. Still further, laminate structure 30 may provide additional strength to the anchor between microspring 12 and substrate 18, in part due to large surface contact area and adhesion to both, as well as the adhesion provided by adhesive layer 34. Structure 30 further provides a gap stop during spring deflection. While structure 30 does allow some give, a limit is reached at which the material resists further deflection of microspring 12. At this point, the smallest gap between structure 10 and a device which device 10 contacts is thereby defined. Furthermore, structure 30 additionally provides a moisture and contaminant barrier, protecting a portion of microspring 12, dielectric layer 20, contact 24, etc., from environmental contamination and damage. Still further, the portion of microspring 12 embedded within laminate structure 30 is protected from chemical processing steps such as plating and soldering, that may be required in certain applications of the present disclosure.

Figure 5:
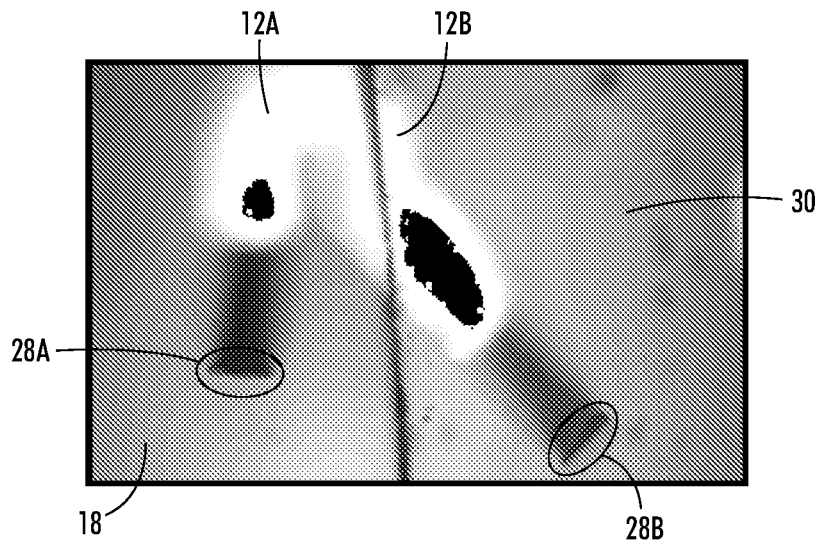
FIG. 5 is a microphotograph of two microsprings, on the left without a laminate structure and on the right embedded within a laminate structure, illustrating that tip heights are approximately equal after embedding in the laminate structure as compared to before embedding in the laminate structure.
Figure 6:
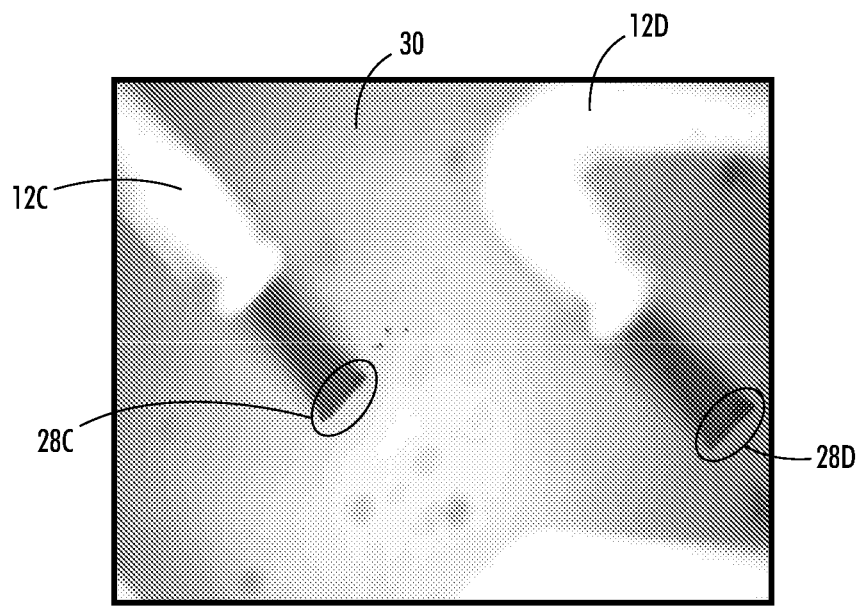
FIG. 6 is a microphotograph of two microsprings, each having been embedded in a laminate structure showing that the two tips protrude through the structure by an approximately equal amount, demonstrating that the process of the present disclosure is applicable to an array of microsprings with substantially uniform results.

FIG. 5 is a microphotograph of two microsprings 12a, 12b with tips 28a, 28b. Microspring 12a is free-standing over substrate 18, while microspring 12b is embedded in a silicone laminate structure 30. The similarity in relative sharpness of the images of tips 28a, 28b confirm that they are approximately equal in height. This confirms that in this embodiment, applying a laminate structure 30 such that tip 28 pierces therethrough results in a tip height of H over the surface on which microspring 12 is formed, and a spacing of tip 28 over a laminate structure of thickness T substantially equal to H-T. Furthermore, FIG. 6 is a microphotograph of two microsprings 12c, 12d, having tips 28c, 28d, respectively, each protruding through a silicone laminate structure 30. The similarity in relative sharpness of the images of tips 28c, 28d confirm that they protrude through silicone laminate structure 30 by an approximately equal amount. Thus, the process of applying laminate structure 30 by way of piercing tips 28 therethrough is applicable to an array of microsprings with substantially uniform results.

Figure 7:
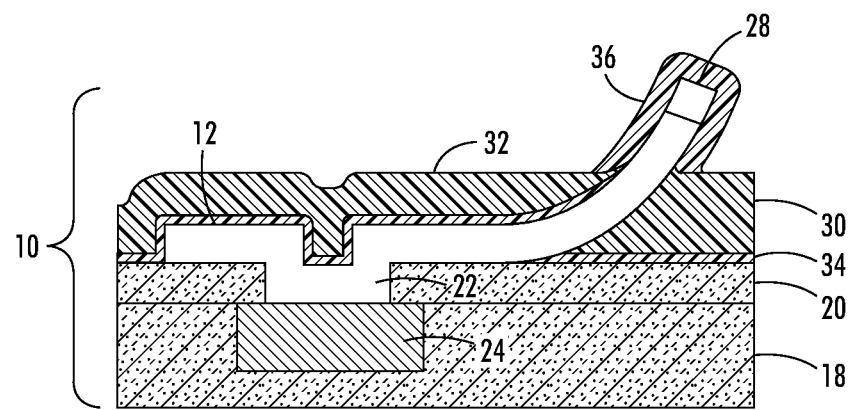
FIG. 7 is a side view of a microspring structure illustrating the plating of the tip of the microspring using the laminate structure as a plating mask.
Figure 8:
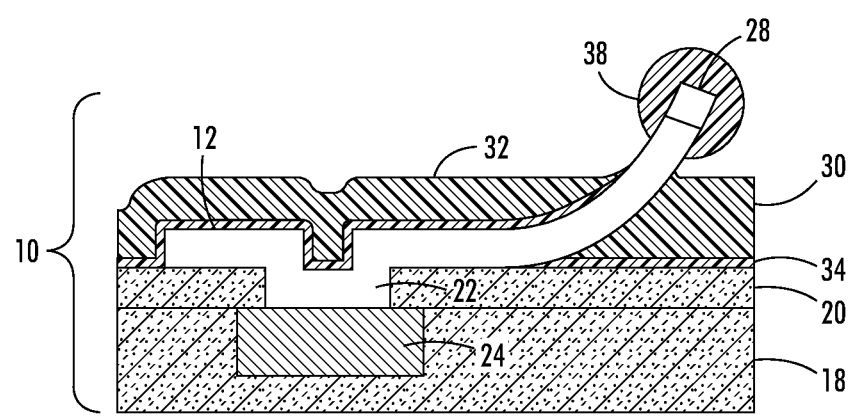
FIG. 8 is a side view of a microspring structure illustrating the application of a solder ball to the tip of the microspring using the laminate structure as a mask.

With reference to FIG. 7, another embodiment of the present disclosure is illustrated. The part of microspring 12 exposed over the upper surface 32 of laminate structure 30, including tip 28, or a portion thereof, can be plated with an appropriate metal 36 to improve the properties of the contact portion of microspring 12, including physical properties such as wear, spring constant, etc., electrical properties such as resistance, etc. Alternatively, solder or similar material can be applied to the part of microspring 12 exposed over the upper surface 32 of laminate structure 30, including tip 28, or a portion thereof, in order to obtain similar results. Other coatings, for example for further physical wear resistance, for controlling the spring constant of the microspring 12, etc., as well as further processing, for example etching to remove oxidization or control size and shape of tip 18, and other appropriate treatments may be applied. In each case, laminate structure 30 may serve as a mask to protect that part of microspring 12 embedded therein. Indeed, the feature that it is possible to selectively cover or process a part of microspring 12 as opposed to its entirety is an important differentiation from prior process such as spin-on coatings and the like.

Figure 9:
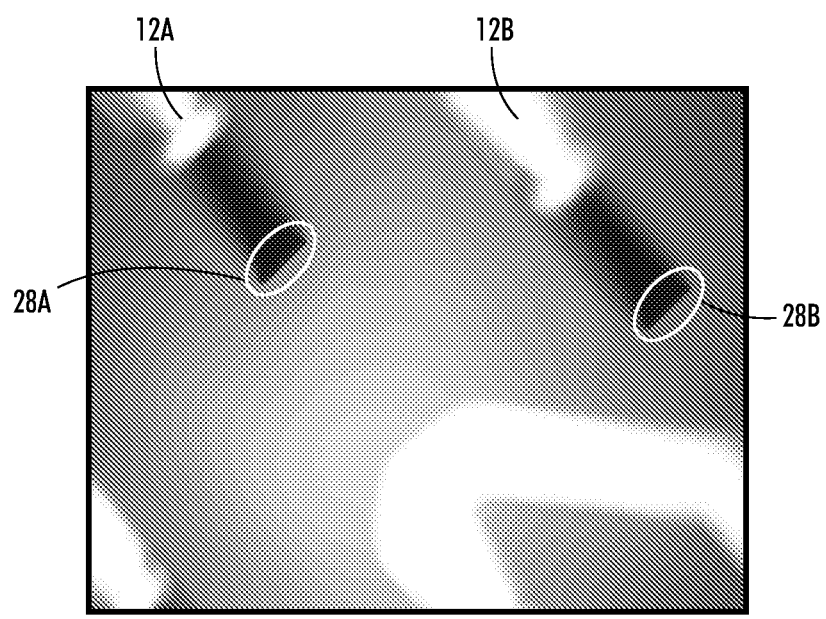
FIG. 9 is a microphotograph of two microsprings after the steps of applying a laminate structure, then removing that laminate structure showing, by way of the similarity in relative sharpness of the images of the two tips that they are approximately equal in height, and that the removal of the silicone laminate structure did not noticeably damage the microsprings.

The application of laminate structure 30 may be reversible, in that it may be removed without damaging microspring 12. This is useful, for example, when it is desired to coat or process a part of microspring 12 located near tip 28, such as the coatings and processes described above, then provide microspring 12 otherwise unaffected for motion, position, etc. FIG. 9 is a microphotograph of two springs 12a, 12b, having tips 28a, 28b, respectively, after the steps of applying a silicone laminate structure (not shown), then removing that laminate structure. Again, the similarity in relative sharpness of the images of tips 28a, 28b confirm that they are approximately equal in height. This confirms that in this embodiment, the removal of the silicone laminate structure did not noticeably damage the microsprings. Another advantage of this aspect of the present disclosure is that in the process of removing the laminate structure the tip of the microspring may be cleaned of particles and contaminants in the process.

In accordance with another embodiment disclosed herein, a laminate structure may be placed over the microspring structure and completely cover the microspring so that the wafer may be handled, processed, etc., with the spring tips protected. At a point in time following the handling, further processing, etc., the laminate structure may be removed in whole or in part to expose the microspring or a portion thereof. The following illustrates these concepts in more detail.

Figure 10:
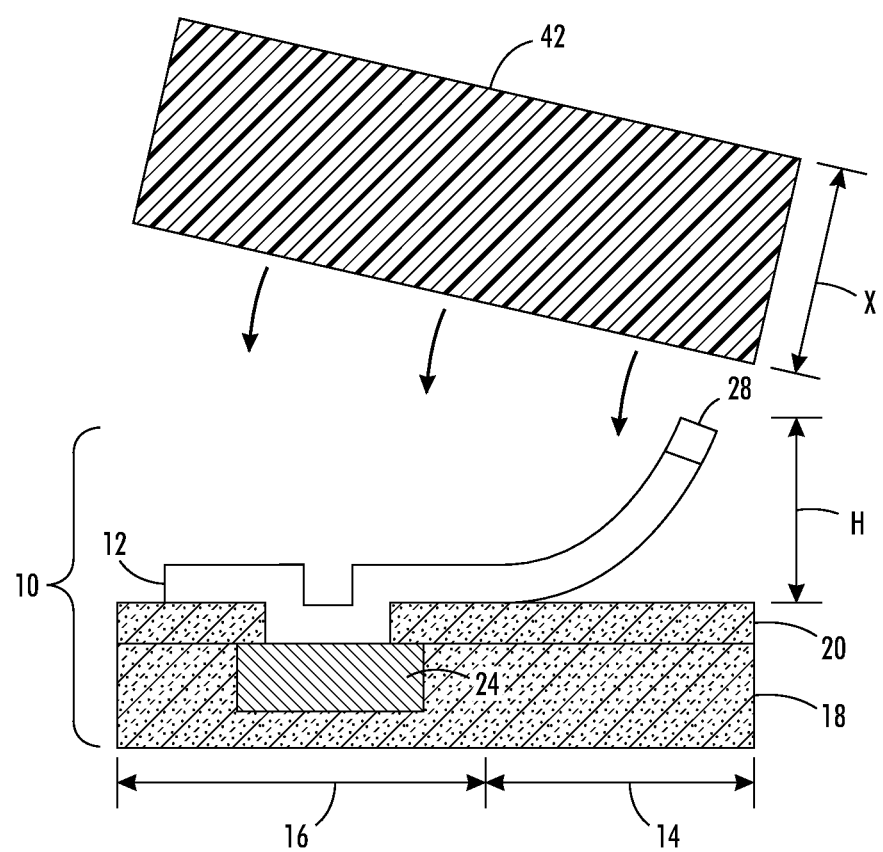
FIG. 10 is a side view of a microspring structure with a thick laminate structure in the process of being applied thereover according to one embodiment of the present disclosure.

With reference to FIG. 10, there is shown therein a first step in the covering of a microspring 12 with a thick protection laminate structure 42. As described previously, once free portion 14 is released, a relatively thick protection laminate structure 42 is applied over the upper surface of structure 10. Microspring 12 extends upward from the surface of dielectric layer 20 to a height H. Protection laminate structure 42 is of a thickness X, where X>H. Protection laminate structure 42 may be fabricated of a variety of materials, but should be relatively soft in order to permit tips 28 to pierce the surface of protection laminate structure 42 and thereby embed a portion of microspring 12 therein without damaging microspring 12. The material from which protection laminate structure 42 is formed should also be strong enough and rigid enough that, once a portion of microspring 12 is embedded therein, structure 42 provides physical and environmental protection for microspring 12. Again, silicone is one example of a material that may meet these somewhat conflicting requirements.

Figure 11:
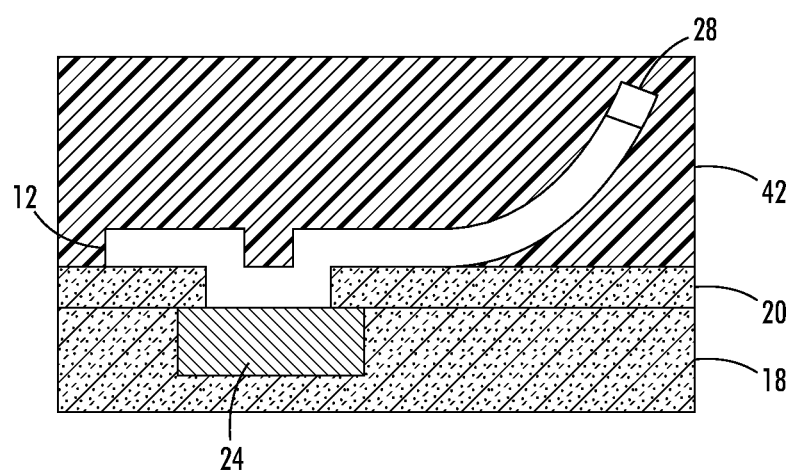
FIG. 11 is a side view of a microspring structure with a thick laminate structure applied thereover according to one embodiment of the present disclosure in which the microspring is fully embedded within the laminate structure.

With reference to FIG. 11, structure 10 is shown with protection laminate structure 42 in place thereover. The entirely of microspring 12 is embedded within protection laminate structure 42. The structure may now be handled with a reduced risk of damaging microspring 12. For example, working from the backside, substrate 18 may now be thinned, for example by grinding, chemical etching, etc., while microspring 12 is protected within protection laminate structure 42. As discussed above, certain materials such as silicone, can be readily removed after application. Thus, by properly selecting the material for protection laminate structure 42, that structure can be removed after any post-formation handling and processing, leaving microspring 12 exposed for contact. In addition, heat and/or optical release techniques may be used to control the relative adhesion of protective laminate structure 42 as well as facilitating its release from structure 10.

Figure 12:
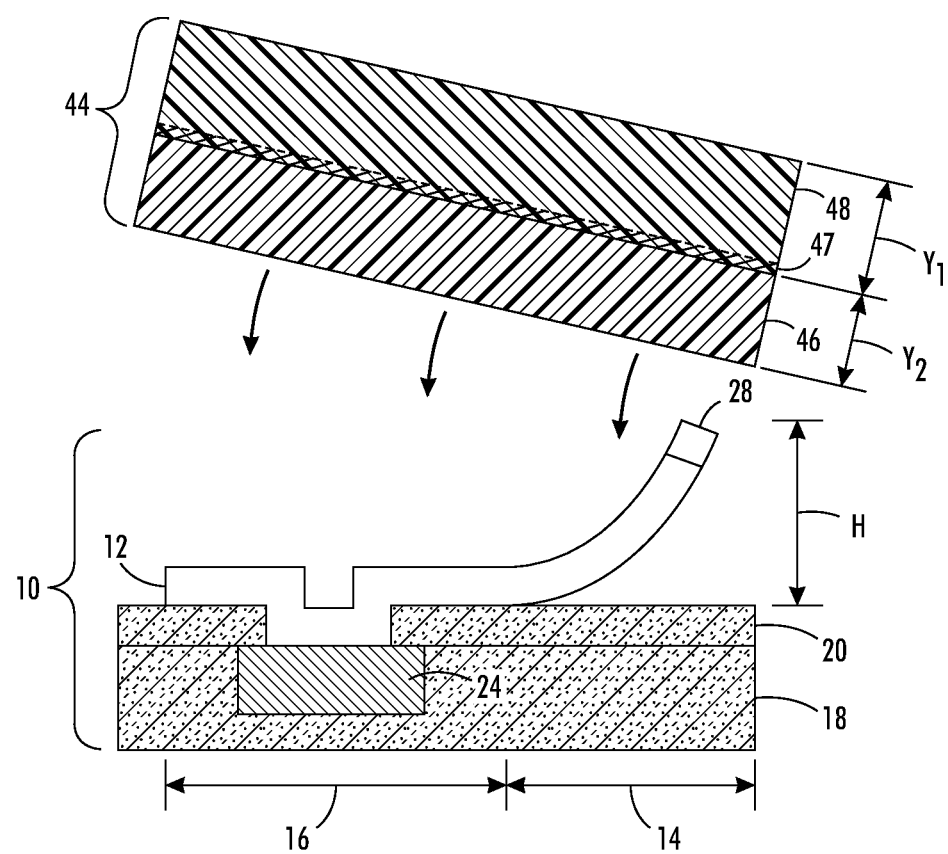
FIG. 12 is a side view of a microspring structure with a thick multi-layered laminate structure in the process of being applied thereover according to one embodiment of the present disclosure.

In accordance with yet another embodiment of the present disclosure, the protective laminate structure having a thickness such that the microspring is fully embedded therein may itself be comprised of at least two layers. One of the layers is intended to remain attached to the microspring structure, while another one of the layers is intended to be removed following handing, further processing, etc. during which the protective laminate structure protect the microspring. FIG. 12 is an example of such an embodiment. As described previously, once free portion 14 is released, a relatively thick protection laminate structure 44 is applied over the upper surface of structure 10. While protection laminate structure 44 shown in FIG. 12 is comprised of two layers 46, 48, in other embodiments additional layers may be employed. The layers may each be comprised of the same material, or may be comprised of different materials, depending on the application of the present disclosure.

Microspring 12 extends upward from the surface of dielectric layer 20 to a height H. The thickness of protection laminate structure 44 is the sum of the thicknesses $Y_1$ and $Y_2$ of layers 46, 48, respectively. The overall thickness of structure 44 will be such that microspring 12 is fully embedded therein, i.e., $Y_1+Y_2>H$. Layers 46, 48 may be fabricated of a variety of materials, taking into consideration the piercing by tip 28 and the level of desired protection discussed above. In one embodiment, each of layers 46, are silicone and are separately formed so that there is a surface energy boundary between the two layers, which facilitates their separation after application to structure 10 and any required handling and processing. In another embodiment, a release layer 47 is disposed between layers 46, 48, which is sufficiently adhesive that layers 46, 48 stick together when applied, but also assists with their subsequent separation. In still another embodiment, a heat-activated or photo-activated layer initially adheres layers 46, 46 together, but with the application of heat or light the layer facilitates separation of layers 46, 48 when needed.

Figure 13:
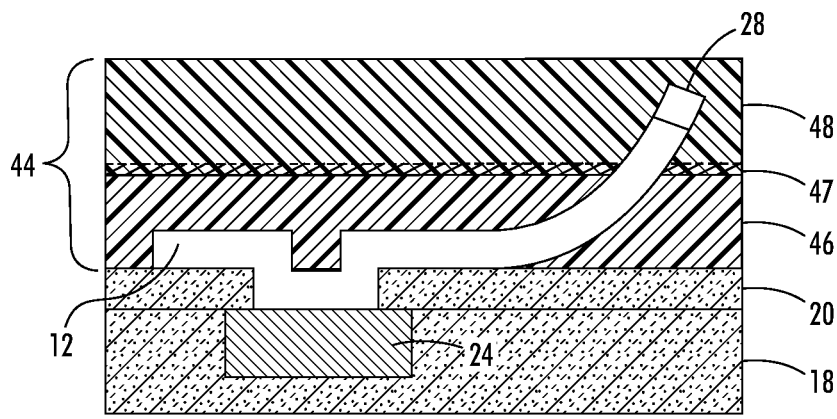
FIGS. 13 and 14 are side views of a microspring structure with a thick multi-layered laminate structure applied thereover according to one embodiment of the present disclosure in which the microspring is fully embedded within the laminate structure (FIG. 13) and in which the laminate structure is in the process of being removed (FIG. 14).
Figure 14:
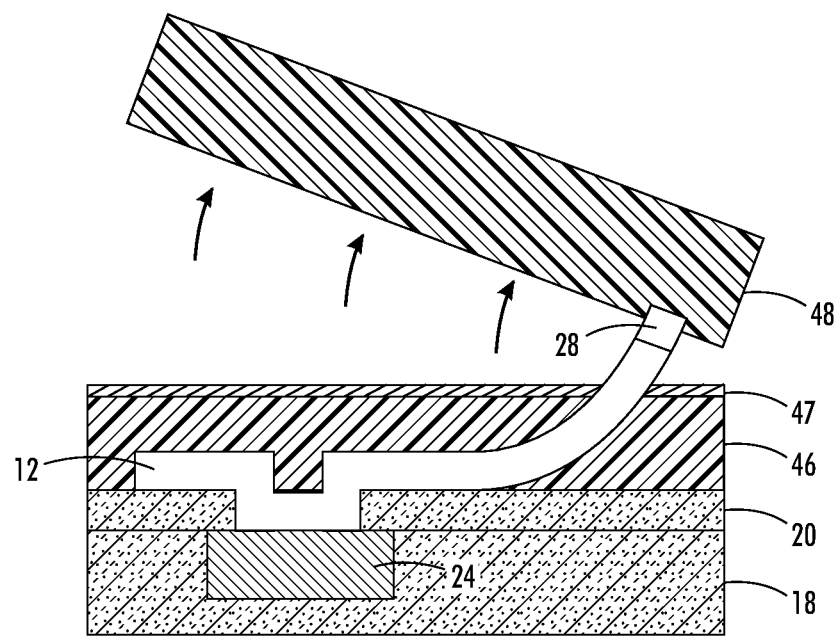

With reference to FIG. 13, structure 10 is shown with protection laminate structure 44 in place thereover. The entirety of microspring 12 is embedded within protection laminate structure 44. The structure may now be handled with a reduced risk of damaging microspring 12. For example, working from the backside, substrate 18 may now be thinned, for example by grinding, chemical etching, etc., while microspring 12 is protected within protection laminate structure 44. Following any handing and processing, layer 48 may then be removed from the structure, as illustrated in FIG. 14, for example using heat or light to assist with the separation of layers 46, 48. By properly selecting the material for layers 46, 48, layer 48 can be removed after any post-formation handling and processing, leaving part of microspring 12 embedded in layer 46, and the remainder of microspring 12 exposed for contact.

Figure 15:
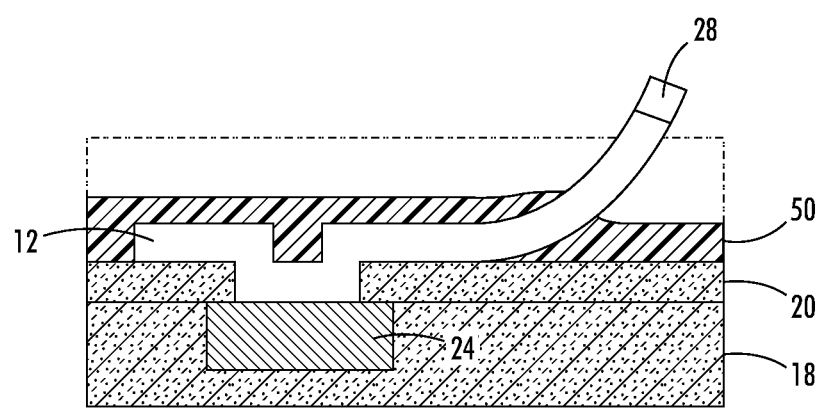
FIG. 15 is a side view of the microspring structure of FIG. 14 following the removal of one layer of the thick multi-layered laminate structure in which the tip portion of the microspring is exposed for contact according to one embodiment of the present disclosure.

As an alternative to the embodiment described above, structure 42 (such as shown in FIG. 11), layer 46 and/or layer 48 may be a photolithographically patternable material. During the processing of the structure, layer 48 may be patterned and etched by techniques known in the art. The etching may fully remove layer 48 or alternatively leave portions of layer 48 in selected locations, such as between individual microsprings in an array of microsprings, in regions under the free portion 14 of microspring 12 to act as a gap stop, etc. An example of such a gap stop 50 is shown in FIG. 15.

Figure 16:
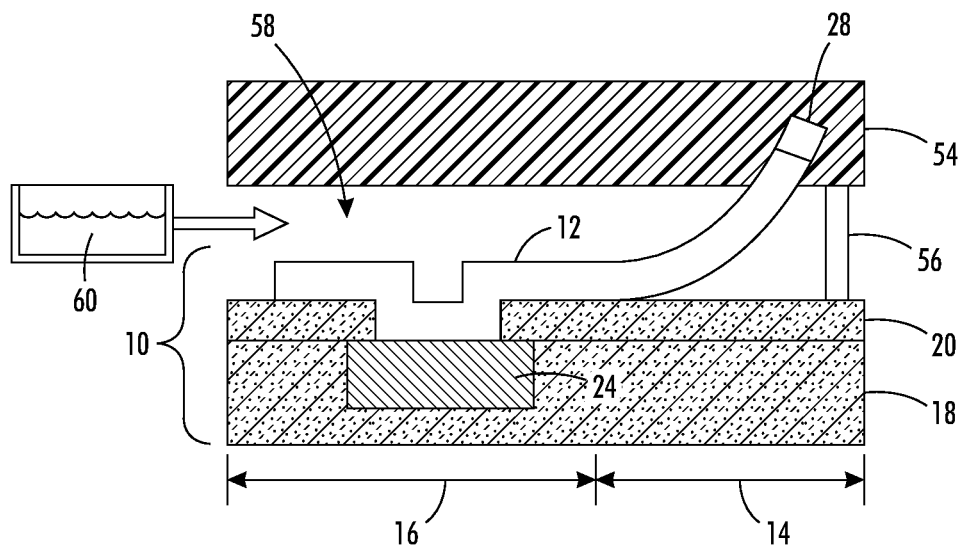
FIG. 16 is a side view of a microspring structure having a mold structure disposed thereover forming a cavity, and in which the tip portion of the microspring is embedded, such that a laminate structure material can be introduced into the cavity according to one embodiment of the present disclosure.
Figure 17:
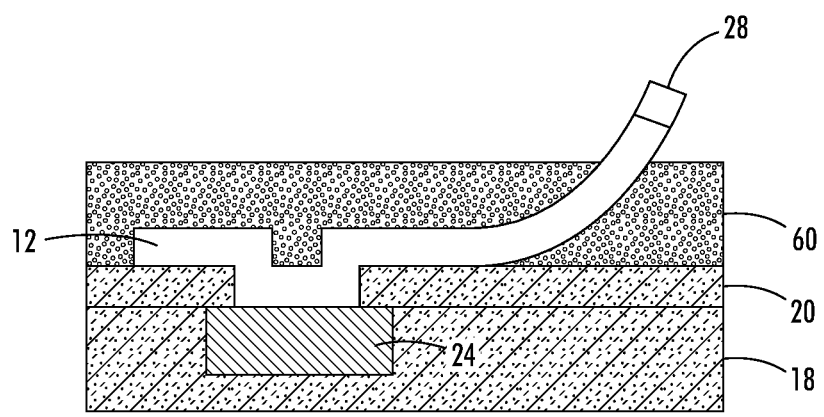
FIG. 17 is a side view of the microspring structure of FIG. 16 following introduction of material into the cavity, curing of the material, and removal of the mold structure, according to one embodiment of the present disclosure.
Figure 18:
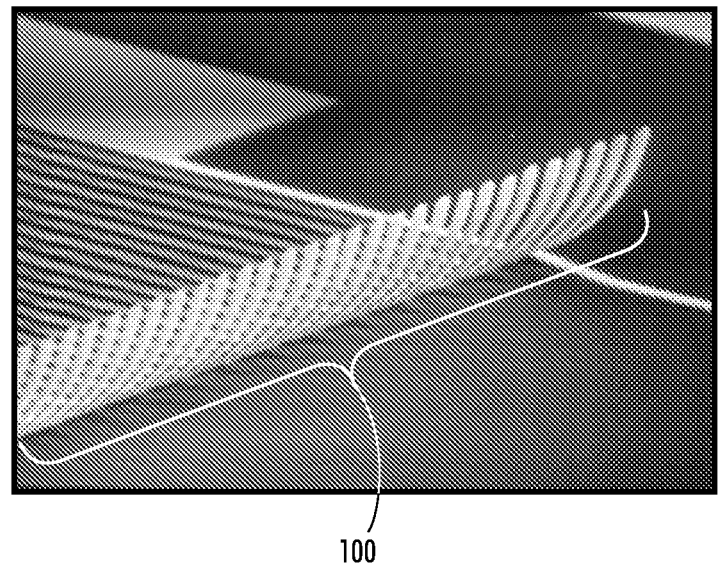
FIG. 18 is a microphotograph of an array of microsprings of a type known in the art.
Figure 19:
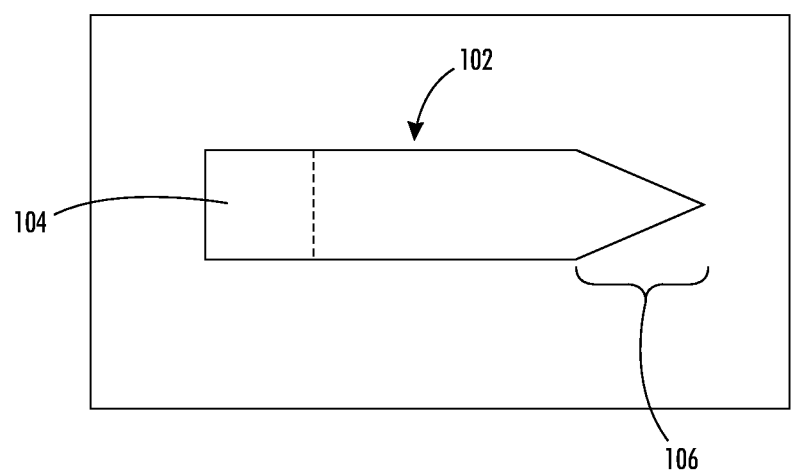
FIG. 19 is a plan view of a microspring having a point-shaped tip of a type known in the art.

In accordance with still another embodiment of the present disclosure, an injection cavity may be formed over a microspring structure, and an appropriate material injected into the cavity to surround a part of the microspring. The injection cavity may be formed between the upper surface of the dielectric layer on which the microspring is formed and a mold structure of material into which the microspring tip may be embedded, which is spaced apart from the dielectric surface. This embodiment is illustrate in FIG. 16. Once free potion 14 is released, a mold structure 54 is disposed over structure 10, such as by resting upon a spacer 56 or other appropriate method. A cavity 58 is thereby formed between structure 10 and mold structure 54. An appropriate material, such as a curable polymer, is then injected into cavity 58 in liquid form. As a portion of microspring 12 is embedded in mold structure 54, that portion of microspring 12 is masked from being embedded in the injected material. The injected material is then cured, and mold structure 54 is thereafter removed. The finished structure is shown in FIG. 17, in which a portion of microspring 12 is embedded in cured polymer 60, and a the remainder of microspring 12 is exposed for contact. Curable polymer is just one example of the materials which may be employed in this embodiment for embedding a portion of microspring 12. Furthermore, it is possible to leverage existing flip-ship packaging processes and apparatus, reducing the need to develop special fixtures, processes, materials and the like to support this aspect of the disclosure.

It should be understood that when a first layer or structure is referred to as being "on" or "over" a second layer, structure or substrate, it can be directly on the second layer, structure or substrate, or on an intervening layer(s) or structure(s) may be therebetween. Further, when a first layer or structure is referred to as being "on" or "over" a second layer, structure or substrate, the first layer or structure may cover the entire second layer, structure or substrate or a portion thereof.

The physics of modern electrical devices and the methods of their production are not absolutes, but rather statistical efforts to produce a desired device and/or result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of exemplary embodiments have been presented in the foregoing detailed description, it should be understood that a vast number of variations exist, and these exemplary embodiments are merely representative examples, and are not intended to limit the scope, applicability or configuration of the disclosure in any way. For example, while the examples described above have predominantly been in terms of a single microspring, this disclosure applies equally to structures with multiple microsprings, such as linear, two-dimensional, and even three-dimensional arrays of microsprings.

In addition, various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A microspring structure, comprising:
    a substrate;
    at least one microspring formed over said substrate; and
    a laminate structure comprises a plurality of layers formed over said substrate such that said microspring is at least partially embedded within said laminate structure, said laminate structure comprised at least in part of silicone.

2. The microspring structure of claim 1, wherein said microspring comprises an anchor portion and a free portion, said anchor portion being affixed over said substrate, and further wherein said anchor portion is embedded within said laminate structure and at least a part of said free portion extends out of said laminate structure and is free to deflect over said substrate.

3. The microspring structure of claim 1, wherein said microspring is fully embedded within said laminate structure.

4. The microspring structure of claim 3, wherein said microspring comprises an anchor portion and a free portion, said anchor portion being affixed over said substrate and fully disposed in a first layer of said laminate structure, and at least a part of said free portion being disposed within a second layer of said laminate structure different than said first layer such that upon removal of said second layer said free portion is disposed so as to be free to deflect over said substrate.

5. The microspring structure of claim 4, wherein said laminate structure further comprises a release layer disposed between said first and second layers.

6. The microspring structure of claim 2, wherein said part of said free portion is plated with a plating metal and that portion of said microspring embedded within said laminate structure is free of said plating metal.

7. The microspring structure of claim 1, wherein said microspring comprises a tip portion, at least said tip portion having solder applied thereto, and that portion of said microspring embedded within said laminate structure is free of solder.

8. The microspring structure of claim 1, wherein said laminate structure further comprises an adhesive layer that adheres said laminate structure over said substrate.

9. The microspring structure of claim 1, wherein said laminate structure comprises at least in part a photolithographically patternable material.

10. The microspring structure of claim 9, wherein said photolithographically patternable material is patterned to form a gap stop proximate said microspring to assist with preventing over-deflection of said microspring in use.

11. A method of fabricating a microspring structure, comprising:
    forming a microspring over a substrate; and
    forming a laminate structure over said substrate such that said microspring is fully embedded within said laminate structure;
    said laminate structure is formed to comprise a plurality of layers;
    said microspring is formed to comprise an anchor portion and a free portion;
    said anchor portion is affixed over said substrate; and
    said laminate structure is formed such that said anchor portion is fully disposed in a first layer of said laminate structure, and at least a part of said free portion is disposed within a second layer of said laminate structure different than said first layer.

12. The method of claim 11, wherein
    said microspring is formed to have an anchor portion and a free portion, said anchor portion being affixed over said substrate; and
    partially removing said laminate structure such that said anchor portion is embedded therein and at least a part of said free portion extends out of said laminate structure and is free to deflect over said substrate.

13. The method of claim 11, further comprising removing said second layer while retaining said first layer over said substrate such that said free portion is disposed so as to be free to deflect over said substrate.

14. The method of claim 13, wherein said laminate structure is formed to further comprise a release layer between said first and second layers, said release layer facilitating separation of said first and second layers such that said first layer is retained over said substrate and said second layer is removed.

15. The method of claim 12, further comprising plating a part of said free portion of said microspring with plating metal, using said laminated structure as a plating mask, such that that portion of said microspring embedded within said laminate structure is free of said plating metal.

16. The method of claim 12, further comprising depositing solder on a part of said free portion of said microspring, using said laminated structure as a solder mask, such that that portion of said microspring embedded within said laminate structure is free of said solder.

17. The method of claim 11, wherein said microspring comprises a tip portion, said laminate structure comprises a pre-formed silicone body, which is applied over said microspring, said tip portion of said microspring piercing said silicone body such that at least a portion of said microspring is thereby embedded in said laminate structure.

18. The method of claim 11, wherein said laminate structure comprises a curable material, and further comprising:
    depositing said curable material over said substrate in an uncured state so as to at least partly embed said microspring; and curing said curable material to partially solidify said curable material and thereby embed at least a part of said microspring in hardened material.

19. The method of claim 11, wherein said laminate structure comprises a photolithographically patternable material, and further comprising:
   depositing said photolithographically patternable material over said substrate such that it at least partly embeds said microspring;
   patterning said photolithographically patternable material; and
   etching said photolithographically patternable material to form a gap stop proximate said microspring to assist with preventing over-deflection of said microspring in use.

* * * * *